(12) United States Patent
Fernald

(10) Patent No.: US 8,456,242 B2
(45) Date of Patent: Jun. 4, 2013

(54) FREQUENCY LOCKED LOOP

(75) Inventor: Kenneth W. Fernald, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 11 days.

(21) Appl. No.: 12/976,373

(22) Filed: Dec. 22, 2010

(65) Prior Publication Data

US 2012/0161829 A1    Jun. 28, 2012

(51) Int. Cl.
*H03L 7/095* (2006.01)

(52) U.S. Cl.
USPC ............... 331/1 A; 331/16; 331/25; 327/156; 327/159

(58) Field of Classification Search
USPC ............ 331/1 A, 25, 16; 327/156, 159
See application file for complete search history.

(56) References Cited

U.S. PATENT DOCUMENTS 4,712,223 A * 12/1987 Nelson ............................ 377/43
7,777,576 B2 * 8/2010 Waheed et al. .................. 331/17

OTHER PUBLICATIONS

Chia-Tsun Wu et al., "A Two-Cycle Lock-In Time ADPLL Design Based On A Frequency Estimaton Algorthm"IEEE Transactions of Circuits and Systems-II: Express Briefs, vol. 57, No. 6, Jun. 2010, pp. 430-434.
Terng-Yin et al., "An All-Digital Phase-Locked Loop (ADPLL)-Based Clock Recovery Circuit," IEEE Journal of Solid-State Circuits, vol. 34, No. 8, Aug. 1999, pp. 1063-1073.

* cited by examiner

*Primary Examiner* — Arnold Kinkead
(74) *Attorney, Agent, or Firm* — Trop, Pruner & Hu, P.C.

(57) ABSTRACT

A locked loop circuit includes an oscillator and an extrapolator. The oscillator generates an output signal in response to a control value. The extrapolator determines, based on a first state of the oscillator and a transfer function of the oscillator the control value for the oscillator to transition the oscillator to a second operating state.

22 Claims, 15 Drawing Sheets

FREQUENCY LOCKED LOOP

BACKGROUND

The invention generally relates to a frequency locked loop.

A frequency locked loop (FLL) typically is used for purposes of generating a signal that is synchronized, or "locked," in frequency and/or phase to a reference signal. For example, when the FLL is locked, the frequency of the FLL's output signal may be a specified multiple of the frequency of the reference signal; and the output signal may have a specific phase relationship to the phase of the reference signal. A frequency locked loop which also locks the phase of the output signal to the phase of the reference signal is also known as a phase locked loop (PLL).

A conventional FLL may include a voltage controlled oscillator (VCO), which generates the FLL's output signal. The VCO's frequency typically is regulated to achieve lock through the use of a feedback loop, which controls the VCO based on a comparison of the output signal with the reference signal. Often, the output signal and the reference signal are divided in frequency before making the comparison. A typical FLL may include a phase detector that compares the phase of the FLL's output signal with the reference signal and controls a charge pump accordingly. The signal that is produced by the charge pump typically is filtered through a loop filter to produce a control signal that regulates the frequency of the VCO.

SUMMARY

In an embodiment of the invention, a technique includes using a frequency locked loop having an oscillator to provide an output signal in response to a reference signal. The technique includes receiving an indication of a first operating state of the oscillator; and based on the indication and on a transfer function of the oscillator, extrapolating a control value for the oscillator to transition the oscillator to a second operating state.

In another embodiment of the invention, a locked loop circuit includes an oscillator and an extrapolator. The oscillator generates an output signal in response to a control value. The extrapolator determines, based on a first state of the oscillator and a transfer function of the oscillator, the control value for the oscillator to transition the oscillator to a second operating state.

In yet another embodiment of the invention, a locked loop circuit includes a first oscillator, a second oscillator, a phase tracker circuit and an extrapolator. The first oscillator generates an output signal in response to a control value; and the phase tracker circuit is adapted to indicate a phase error between the output signal and a reference signal as a function of a number of cycles of the second oscillator. The extrapolator determines the control value for the first oscillator to transition the first oscillator to a new operating state based on a transfer function of the first oscillator and the phase error that is indicated by the phase tracker circuit.

Advantages and other features of the invention will become apparent from the following drawing, description and claims.

DETAILED DESCRIPTION

Figure 1:
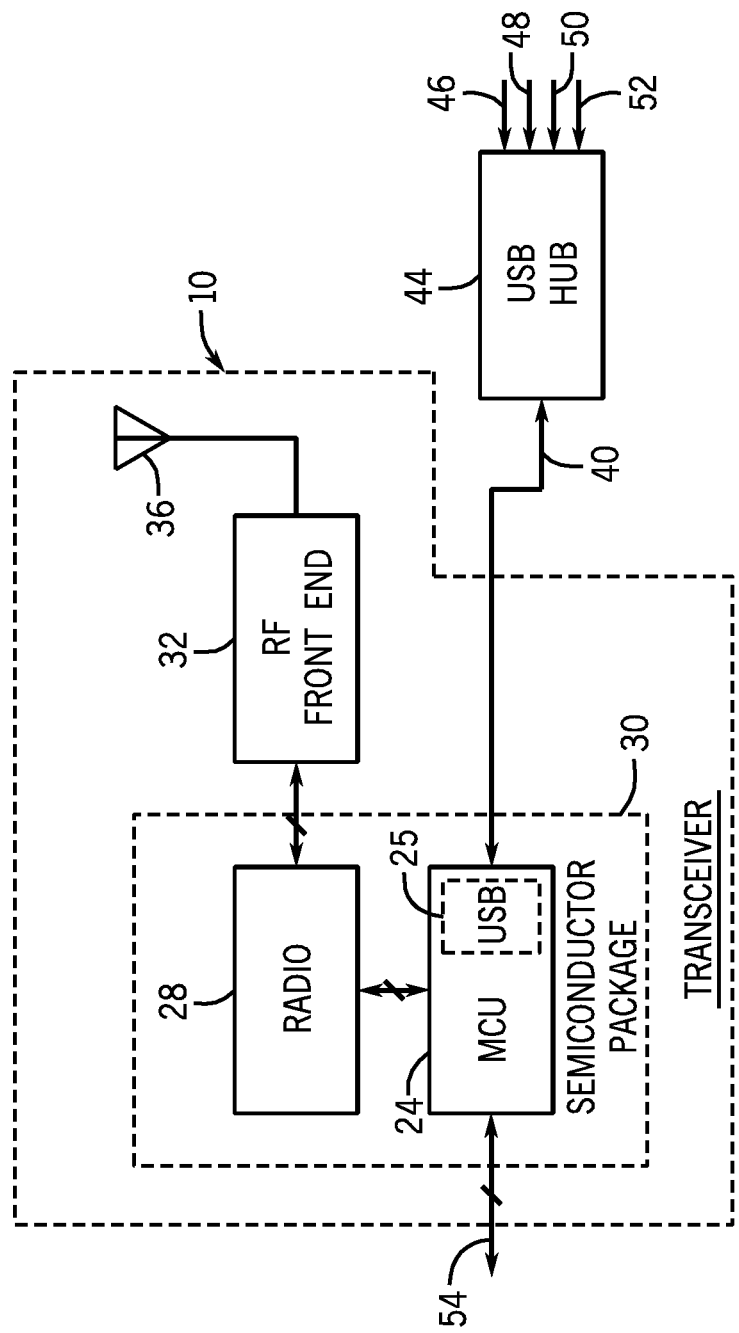
FIG. 1 is a schematic diagram of a transceiver system according to an embodiment of the invention.

Referring to FIG. 1, in accordance with embodiments of the invention disclosed herein, a microcontroller unit (MCU) 24 may be used in a variety of applications, such as applications in which the MCU 24 controls various aspects of a transceiver 10 (as a non-limiting example). In this regard, the MCU 24, for this particular example, may be part of an integrated circuit (IC), or semiconductor package 30, which also includes a radio 28. As a non-limiting example, the MCU 24 and the radio 28 may collectively form a packet radio, which processes incoming and outgoing streams of packet data. To this end, the transceiver 10 may further include a radio frequency (RF) front end 32 and an antenna 36, which receives and transmits RF signals (frequency modulated (FM) signals, for example) that are modulated with the packet data.

As non-limiting examples, the transceiver 10 may be used in a variety of applications that involve communicating packet stream data over relatively low power RF links and as such, may be used in wireless point of sale devices, imaging devices, computer peripherals, cellular telephone devices, etc. As a specific non-limiting example, the transceiver 10 may be employed in a smart power meter which, through a low power RF link, communicates data indicative of power consumed by a particular load (a residential load, for example) to a network that is connected to a utility. In this manner, the transceiver 10 may transmit packet data indicative of power consumed by the load to mobile meter readers as well as to an RF-to-cellular bridge, for example. Besides transmitting data, the transceiver 10 may also receive data from the utility or meter reader for such purposes (as non-limiting examples) as inquiring as to the status of various power consuming devices or equipment; controlling functions of the smart power meter; communicating a message to a person associated with the monitored load, etc.

As depicted in FIG. 1, in addition to communicating with the radio 28, the MCU 24 may further communicate with other devices and in this regard may, as examples, communicate over communication lines 54 with a current monitoring and/or voltage monitoring device of the smart power meter as well as communicate with devices over a Universal Serial Bus (USB) 40. For example, various USB links 46, 48, 50 and 52 may communicate via a hub 44 and USB 40 with the transceiver 10 for such purposes as communicating with a residential computer regarding power usage of various appliances, communicating with these appliances to determine their power usages, communicating with the appliances to regulate their power usages, etc. For purposes of communicating with the USB 40, the MCU 24 has an integrated USB interface 25, in accordance with some embodiments of the invention.

Figure 2:
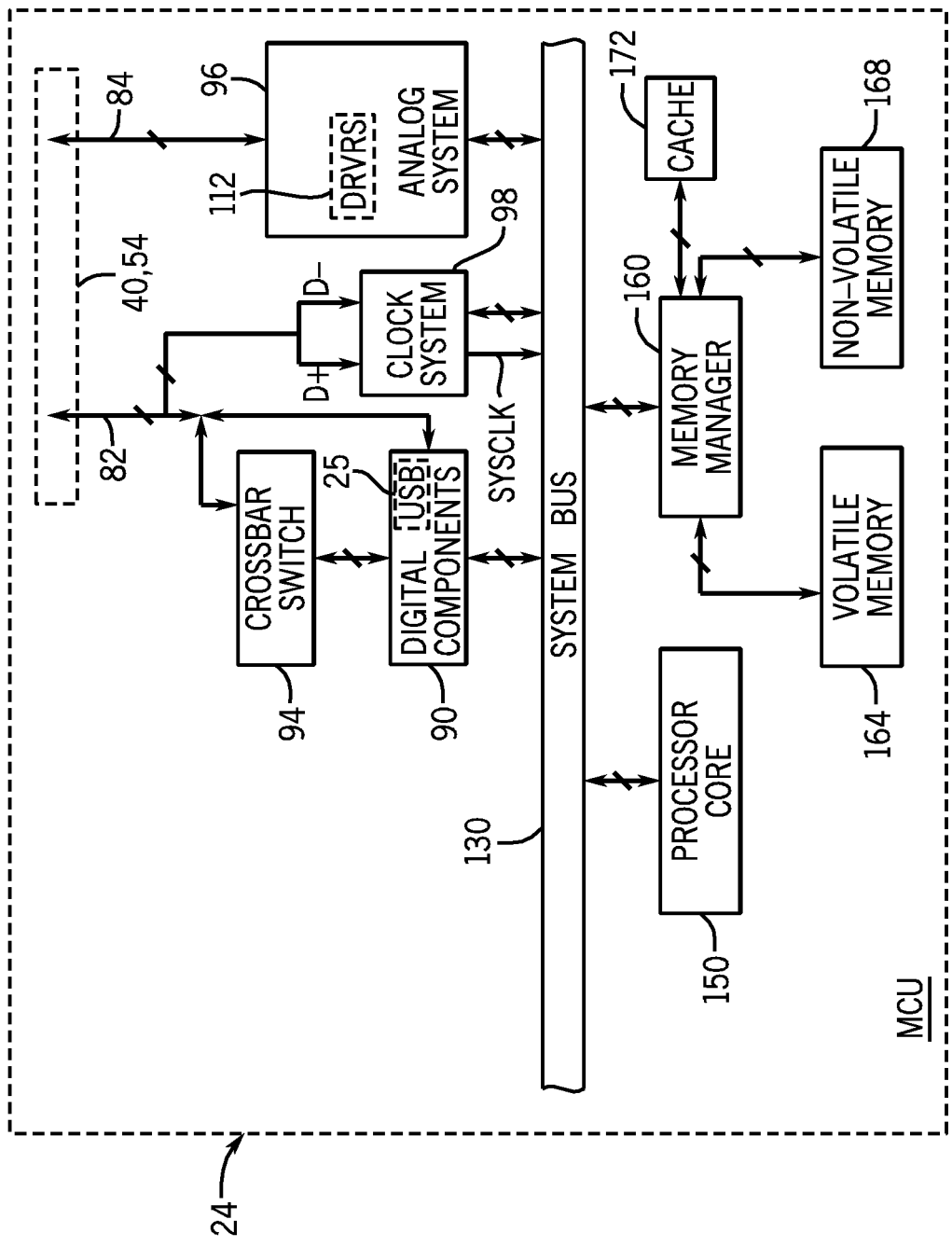
FIG. 2 is a schematic diagram of a microcontroller unit according to an embodiment of the invention.

In accordance with embodiments of the invention, the MCU 24 is a "system on a chip," which includes various components, such as the components that are depicted in FIG. 2, which may be fabricated on the same die. Referring to FIG. 2, among these components, the MCU 24 includes a processor core 150. As a non-limiting example, the processor core 150 may be a 32-bit core, such as the Advanced RISC Machine (ARM) processor core, which executes a Reduced Instruction Set Computer (RISC) instruction set. In general, the processor core 150 communicates with various other system components of the MCU 24, such as a memory controller, or manager 160, over a system bus 130. In general, the memory manager 160 controls access to various memory components of the MCU 24, such as a cache 172, a non-volatile memory 168 (a Flash memory, for example) and a volatile memory 164 (a static random access memory (SRAM), for example).

The MCU 24 also includes various digital peripheral components 90, such as (as non-limiting examples) the USB interface 25, a programmable counter/timer array (PCA), a universal asynchronous receiver/transmitter (UART), a system management bus (SMB) interface, a serial peripheral interface (SPI), etc. The MCU unit 24 may include a crossbar switch 94, which permits the programmable assigning of the digital peripheral components 90 to digital output terminals 82 of the MCU 24. In this regard, the MCU 24 may be selectively configured to selectively assign certain output terminals 82 to the digital peripheral components 90.

In accordance with embodiments of the invention, the MCU 24 also includes an analog system 96, which includes various interfaces to analog terminals 84 of the MCU 24. For example, the analog system 96 may include various components that receive analog signals, such as analog-to-digital converters (ADCs), comparators, etc. Moreover, the analog system 96 may include such other components as one or more low dropout (LDO) converters and one or more current drivers 112 that may be generally controlled by software of the MCU 24.

Figure 3:
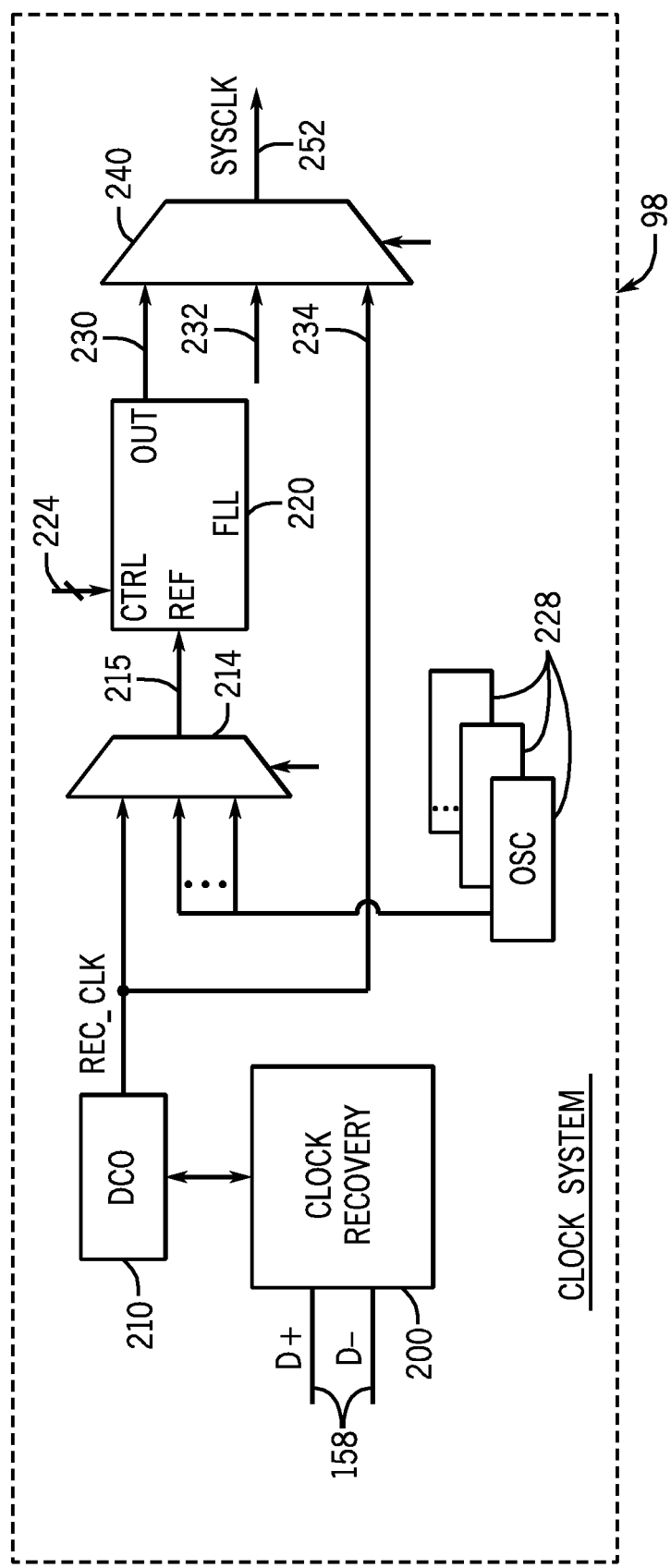
FIG. 3 is a schematic diagram of a clock system of the microcontroller unit of FIG. 2 according to an embodiment of the invention.

The MCU 24 also includes a clock system 98, which supplies one or more system clock signals (one of which is called "SYSCLK" in FIG. 2) to the system bus 130, which is used to clock operations, for example, of the processor core 150. Referring to FIG. 3, in accordance with some embodiments of the invention, the clock system 98 may be configured by the processor core 150 to select one of a number of different sources for the SYSCLK system clock signal, such as the clock signals that are generated by relatively low and high frequency oscillators 228 (crystal-based as well as RC-based oscillators, for example), as well as a clock signal (called the "REC_CLK" reference clock signal herein) that a clock recovery circuit 200 of the system 98 recovers from the bursty data communications that occur on the USB 40. In this manner, the clock recovery circuit 200 receives data signals (labeled as the "D+" and "D−" in FIG. 3) from the USB 40, and from these signals, the clock recovery circuit 200 extracts the relatively high accuracy (within one quarter percent of the nominal USB clock frequency) clock signal from the USB 40.

In addition to imparting the ability to select the clock sources that are set forth above, the clock system 98 also permits the REC_CLK reference clock signal to be used as a reference to a frequency locked loop (FLL) 220 for purposes of generating a SYSCLK system clock signal that has a frequency different from the frequency of the REC_CLK reference clock signal. In the context of this application, the language "frequency locked loop" means a circuit that locks onto the frequency of a reference signal to produce a corresponding output signal whose frequency has a predefined relationship with respect to the frequency of the reference signal. In the context of this application, the term "reference signal," unless otherwise specifically defined, refers to either an undivided reference signal or a divided reference signal. Also, in the context of this application, unless otherwise specifically defined, the term "output signal" means an undivided output signal or a divided output signal. In the clock system 98, the FLL 220 generates an output clock signal (provided at terminal 230), which has a frequency that is scaled by N/M, where "N" and "M" are both integers that are programmable (via terminals 224) by the processor core 150 or another component, for example. Thus, depending on the values of N and M, the output clock frequency of the FLL 220 may be greater than, equal to or less than the frequency of the REC_CLK reference clock signal.

In addition to locking onto the frequency of the REC_CLK reference clock signal, the FLL 220 may further function as a phase locked loop (PLL), in which the FLL 220 establishes a predefined phase offset between the output clock signal and the REC_CLK reference clock signal. Although frequency locking may establish a fixed phase offset between the REC_CLK and output clock signals, the PLL mode of the FLL 220 permits the precise phase offset to be selected. For example, in accordance with some embodiments of the invention, the FLL 220 establishes a zero phase offset such that logic level transitions resulting in rising, or positive, edges of the REC_CLK reference clock signal are aligned in time with positive edges of the output clock signal. The FLL 220 may establish other predefined phase offsets, other than a zero phase offset, in accordance with other embodiments of the invention.

As depicted in FIG. 3, in accordance with some embodiments of the invention, the FLL 220 has a reference terminal 215 that, depending on the selection by a multiplexer 214, receives the REC_CLK reference clock signal or another reference clock signal, such as one of a number of clock signals that are provided by the oscillators 228, for example.

In addition to allowing selectable reference clock signals for the FLL 220, the clock system 98 also permits the selection of other clock signals for the SYSCLK system clock signal. In this manner, as depicted in FIG. 3, the SYSCLK system clock signal is provided at an output terminal 252 of a multiplexer 240, which is controlled by the processor core 150, for example. In this regard, depending on the particular selection signals that are received by the multiplexer 240, the multiplexer 240 may select the output clock signal provided by the FLL 220 as well as REC_CLK reference clock signal. Moreover, as depicted in FIG. 3, the multiplexer 240 may have additional input terminals, such as input terminal 232, which receives at least one additional input clock source signal, such as a signal produced by a crystal-based oscillator, for example.

Figure 4:
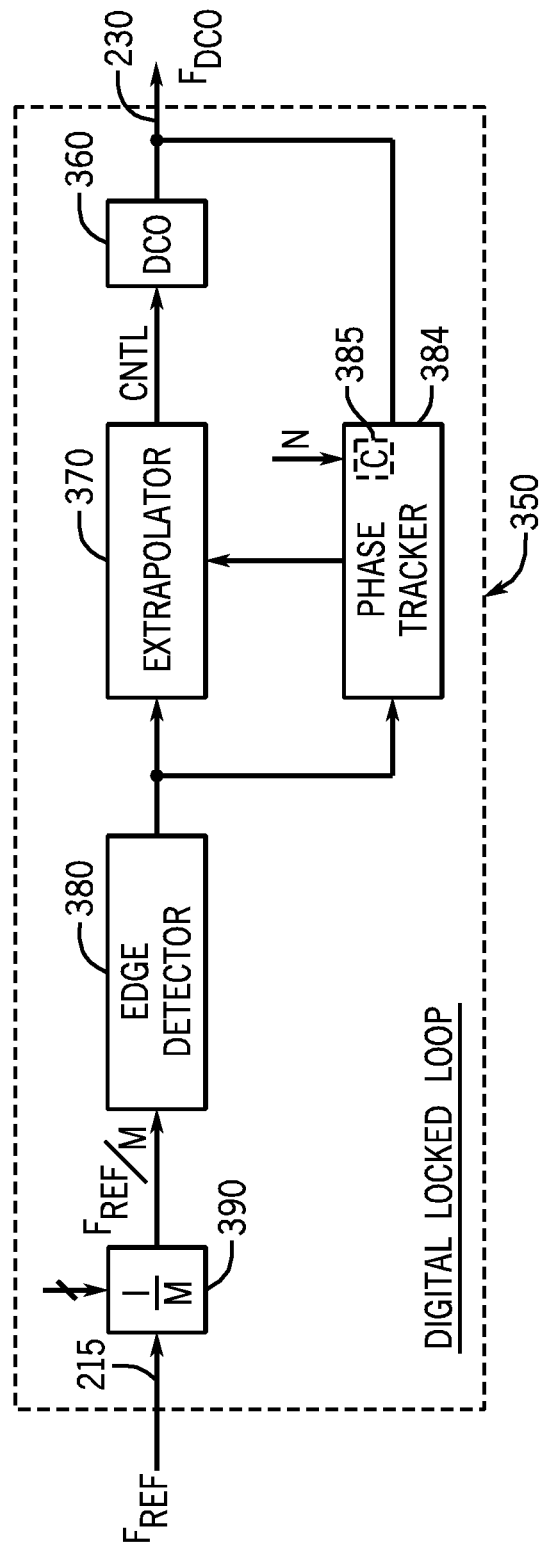
FIGS. 4, 13 and 16 are schematic diagrams of digital locked loops according to embodiments of the invention.

Referring to FIG. 4, in accordance with some embodiments of the invention, the FLL 220 (see FIG. 3) may be a digital locked loop (DLL) 350 that has a digitally-controlled oscillator (DCO) 360. The output terminal of the DCO 360 furnishes a signal that is called "the output clock signal" herein and has a frequency called "$F_{DCO}$" as depicted in FIG. 4. The $F_{DCO}$ frequency is a function of and thus, is adjusted by, a control value (called "CNTL" herein) that the DLL 350 provides to the DCO 360, in accordance with some embodiments of the invention. More specifically, when the DLL 350 is first enabled, the DLL 350 is generally not frequency locked to the frequency (called "$F_{REF}$" in FIG. 4) of the reference clock signal. As further described below, after being enabled, the DLL 350 adjusts the CNTL control value to frequency lock the DLL 350 to the reference clock signal.

Figure 5:
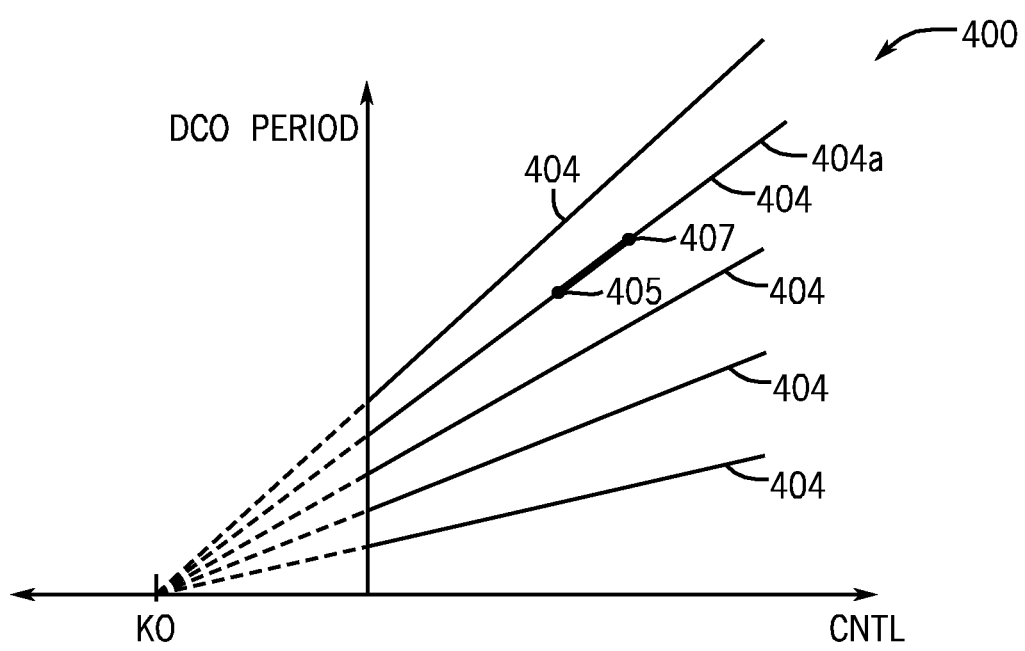
FIG. 5 is an illustration of transfer characteristics of the digitally-controlled oscillator of the digital locked loop for different frequency ranges of operation according to an embodiment of the invention.

For purposes of achieving this frequency lock, the DLL 350 includes an extrapolator 370, which generates the CNTL control value based on, among other factors, the transfer function of the DCO 360. In this manner, the "transfer function" of the DCO 360 is the relationship between the oscillation frequency or period of the DCO 360 and the CNTL control value. More specifically, referring to FIG. 5 in conjunction with FIG. 4, in accordance with some embodiments of the invention, the transfer function of the DCO 360 is modeled as being linear. As a non-limiting example, as shown in FIG. 5, the oscillation period of the DCO 360 versus the CNTRL control value may be modeled as a linear relationship that is represented by a line 404. It is noted that FIG. 5 depicts multiple lines 404, with the specific line 404 being selected based on the particular operating frequency range that is selected for the DCO 360.

Although the linear model is specifically discussed herein in a non-limiting example, the transfer function of the DCO 360 may be modeled as being non-linear (exponential, logarithmic, etc.), in accordance with other embodiments of the invention. Thus, many variations are contemplated and are within the scope of the appended claims.

As a more specific example, assuming that the frequency range that is selected for the DCO 360 corresponds to transfer function 404a, the DCO 360 may be at a current operating state that is illustrated at point 405 on the transfer function 404a. The extrapolator 370 may determine, as further described below, that the operating point of the DCO 360 should be moved to a new operating point 407 on the transfer function 404a for frequency locking to occur. To achieve this change, the extrapolator 370 takes into consideration the linear nature of the specific transfer function 404a to extrapolate the corresponding CNTL control value. Furthermore, if the corresponding CNTL control value falls outside specific limits, the extrapolator 370 may automatically select a different frequency range and repeat the extrapolation. For example, if an extrapolated CNTL control value exceeds a specific upper limit, the extrapolator 370 may select a lower frequency range and determine a new CNTL control value given this new frequency range. Similarly, if an extrapolated CNTL control value falls below a specific lower limit, the extrapolator 370 may select a higher frequency range and determine a new CNTL control value given this new frequency range.

For the following example of a control scheme employed by the extrapolator 370, it is assumed that the DLL 350 simultaneously performs frequency and phase locking. Another control scheme in which a DLL first performs frequency locking and optionally subsequently performs phase locking in a two stage control scheme is discussed further below in connection with FIG. 13.

As depicted in FIG. 4, in accordance with some embodiments of the invention, the actual reference clock signal that is tracked by the DLL 350 is a frequency-divided version of the reference clock signal that is received at the reference terminal 215 of the DLL 350. In this manner, in accordance with some embodiments of the invention, the DLL 350 includes a frequency divider 390, which divides the reference clock signal that appears on the reference terminal 215 by the programmable integer M to produce a signal called the "frequency-divided reference clock signal" herein. As depicted in FIG. 4, the frequency-divided reference clock signal has a frequency of $F_{REF}/M$. In accordance with other embodiments of the invention, the frequency divider 390 is not restricted to integer values of M. Thus, other dividers, such as dividers that support fractional divide values, may be used and are within the scope of the appended claims.

The DLL 350 also includes an edge detector 380 and a phase tracker 384. The edge detector 380 detects the rising, or positive, edges of the frequency-divided reference clock signal and provides a signal indicating detection of these edges to the extrapolator 370 and phase tracker 384. In other embodiments of the invention, the edge detector 380 may be replaced with an edge detector that detects the falling, or negative, edges of the frequency-divided reference clock, or both edges of the frequency-divided reference clock. The phase tracker 384 measures how many periods of the output clock signal elapse during a given period of the frequency-divided reference clock signal. More specifically, the phase tracker 384 includes an incrementing counter 385 that is clocked by the output clock signal and thus, increments its stored value in response to each cycle of the output clock signal. As a non-limiting example, the counter 385 many increment its stored count in response to each rising, or positive, edge of the output clock signal. In other embodiments of the invention, the counter 385 may be replaced with a counter that decrements the stored count in response to detected edges of the output clock signals or increases or decreases the stored count in steps other than one.

The counter 385 cycles through "N" counts when the DLL 350 is frequency locked, where "N" is a programmable integer (via the processor core 150, for example) and represents how many periods of the output clock signal occur during one frequency-divided reference clock period when the DCO 350 is frequency locked. Therefore, when the DLL 350 is frequency locked, the $F_{DCO}$ frequency is equal to $F_{REF}\cdot N/M$. In accordance with other embodiments of the invention, the counter 385 may be replaced with a counter that is not restricted to integer values of N. Thus, other counters, including counters that support fractional count values, may be alternatively used and are within the scope of the appended claims.

In a control scheme according to some embodiments of the invention, when the DLL 350 is frequency and phase locked, the value of the counter 385 is initialized to −N at one positive edge of the frequency-divided reference clock signal; and the counter 385 increments to a value of zero right before the next positive edge of the frequency-divided reference clock signal. The extrapolator 370 regulates the CNTL control value based on the transfer function of the DCO 360 and the count values provided by the counter 385 to control the DCO 360 to achieve and maintain frequency and phase locking, as further described below.

Figure 6:
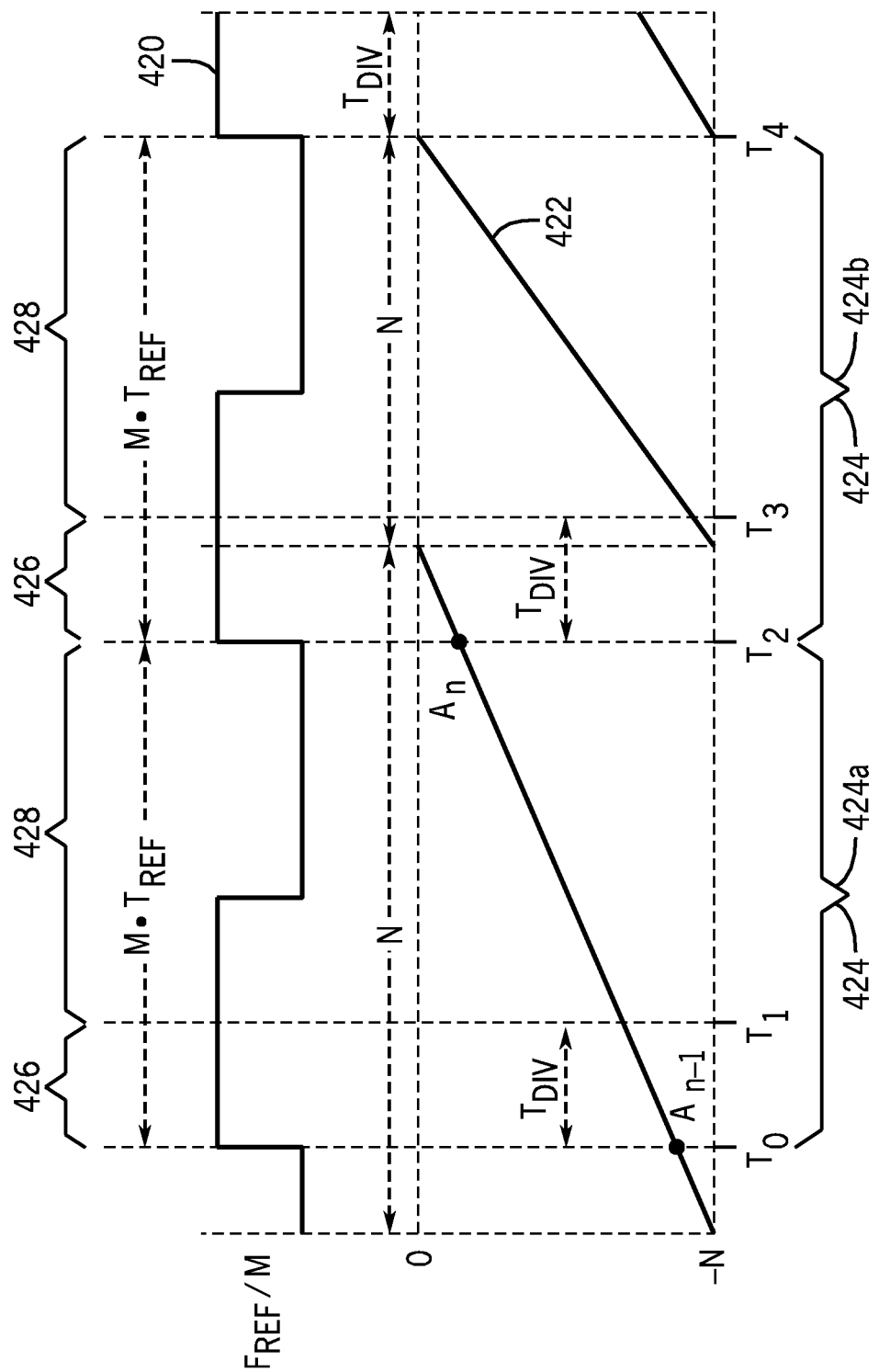
FIGS. 6-8 are waveforms illustrating extrapolation of a control value for the digitally-controlled oscillator according to embodiments of the invention.

To illustrate one type of control scheme that may be employed by the DLL 350, FIG. 6 depicts an exemplary waveform 420 of the frequency-divided reference clock signal and an exemplary waveform 422 of the count value provided by the counter 385 for two successive cycles 424 of the waveform 420: an initial cycle 424a during which the DLL 350 is unlocked and an immediately successive cycle 424b in which the DLL 350 achieves frequency and phase locking.

Referring to FIG. 6 in conjunction with FIG. 4, in response to the signaling from the edge detector 380, the extrapolator 370 samples the count value of the counter 385 on each positive edge of the waveform 420. Thus, for the example depicted in FIG. 6, at time $T_0$ at the beginning of the cycle 424a, the counter value is $A_{n-1}$; and at time $T_2$ at the end of the cycle 424a, the counter value is $A_n$. When the DLL 350 is locked, the number of counts over the duration of the cycle 424a (i.e., $A_n$ less $A_{n-1}$) is N. However, as depicted in FIG. 6, during the initial cycle 424a, the counter 385 is clocked less than N times. Although not illustrated, it is noted that in the unlocked state of the DLL 350, the counter 385 may alternatively be clocked by more than N cycles.

During each cycle 424, the extrapolator 370 takes the same finite time (called "$T_{DIV}$" in FIG. 6) to calculate a new CNTL control value. More specifically, the extrapolator 370, whose operations may be clocked by the DCO's output clock signal, take the same number of DCO cycles to determine the next CNTL control value. Therefore, each cycle 424 includes time 426 in which the DCO 360 is operating under the old CNTL control value (i.e., the $T_{DIV}$ time in which the extrapolator 370 is calculating the new CNTL control value) and an immediately successive time 428 that is controlled according to the new CNTL control value. Specifically, for the cycle 424a, the DCO 360 is controlled by the previously-determined CNTL control value, and the extrapolator 370 is calculating the new CNTL control value during the time 426 from time $T_0$ to time $T_1$; and the DCO 360 is controlled by the new CNTL control value during the remainder 428 of the cycle 424a from time $T_1$ to time $T_2$.

In accordance with some embodiments of the invention, the new CNTL control value is derived based on the following. The periods of two cycles of the frequency-divided reference clock signal, such as cycles 424a and 424b, may be equated, because the period of this signal may be assumed to be constant. Equating the two periods produces the following relationship:

$$T_{n-1} \cdot Q_{DIV} + (A_n - A_{n-1} - Q_{DIV}) \cdot T_n = T_n \cdot Q_{DIV} + (N - A_n - Q_{DIV}) \cdot T_{n+1} \quad \text{Eq. 1}$$

where "$Q_{DIV}$" represents the number of cycles of the output clock signal in the time $T_{DIV}$ time, i.e., the number of DCO cycles it takes to calculate the CNTL control value; "$T_{n-1}$" represents the period of the DCO 360 prior to time $T_1$; and "$T_n$" represents the period of the DCO 360 from $T_1$ to time $T_3$. In general, the $T_n$ period is a function of the transfer function of the DCO 360, in accordance with some embodiments of the invention, as described below:

$$T_n = J_R \cdot (CNTL_n - K_0) \quad \text{Eq. 2}$$

where "$J_R$" represents a constant that describes the slope of the transfer function for a selected frequency range for the DCO 360, as illustrated by the different transfer functions 404 in FIG. 5. The $J_R$ constant cancels out of the equations used in the derivation of the CNTL control value.

In the following discussion, the following substitution is applied to clarify the equations:

$$C_n = (CNTL_n - K_0) \quad \text{Eq. 3}$$

where "$C_n$" represents a normalized control value. Given the relationships that are set forth in Eqs. 2 and 3, Eq. 1 may be rewritten as follows:

$$C_{n-1} \cdot Q_{DIV} + (A_n - A_{n-1} - Q_{DIV}) \cdot C_n = C_n \cdot Q_{DIV} + (N - A_n - Q_{DIV}) \cdot C_{n+1} \quad \text{Eq. 4}$$

where "$C_{n-1}$" represents the prior normalized control value (prior to time $T_1$); and $C_{n+1}$ represents the new normalized control value. Based on Eq. 4, the $C_{n+1}$ new normalized control value, which is calculated by the extrapolator 370 is the following:

$$C_{n+1} = \frac{C_{n-1} \cdot Q_{DIV} + C_n \cdot (A_n - A_{n-1} - Q_{DIV}) - C_n \cdot Q_{DIV}}{N - A_n - Q_{DIV}}. \quad \text{Eq. 5}$$

In Eq. 5, the expression "$C_{n-1} \cdot Q_{DIV} + C_n \cdot (A_n - A_{n-1} - Q_{DIV})$" represents the active normalized control value accumulated between the positive edges of the frequency-divided clock signal, and $C_n \cdot Q_{DIV}$ represents a correction for the CNTL control value processing time.

Figure 7:
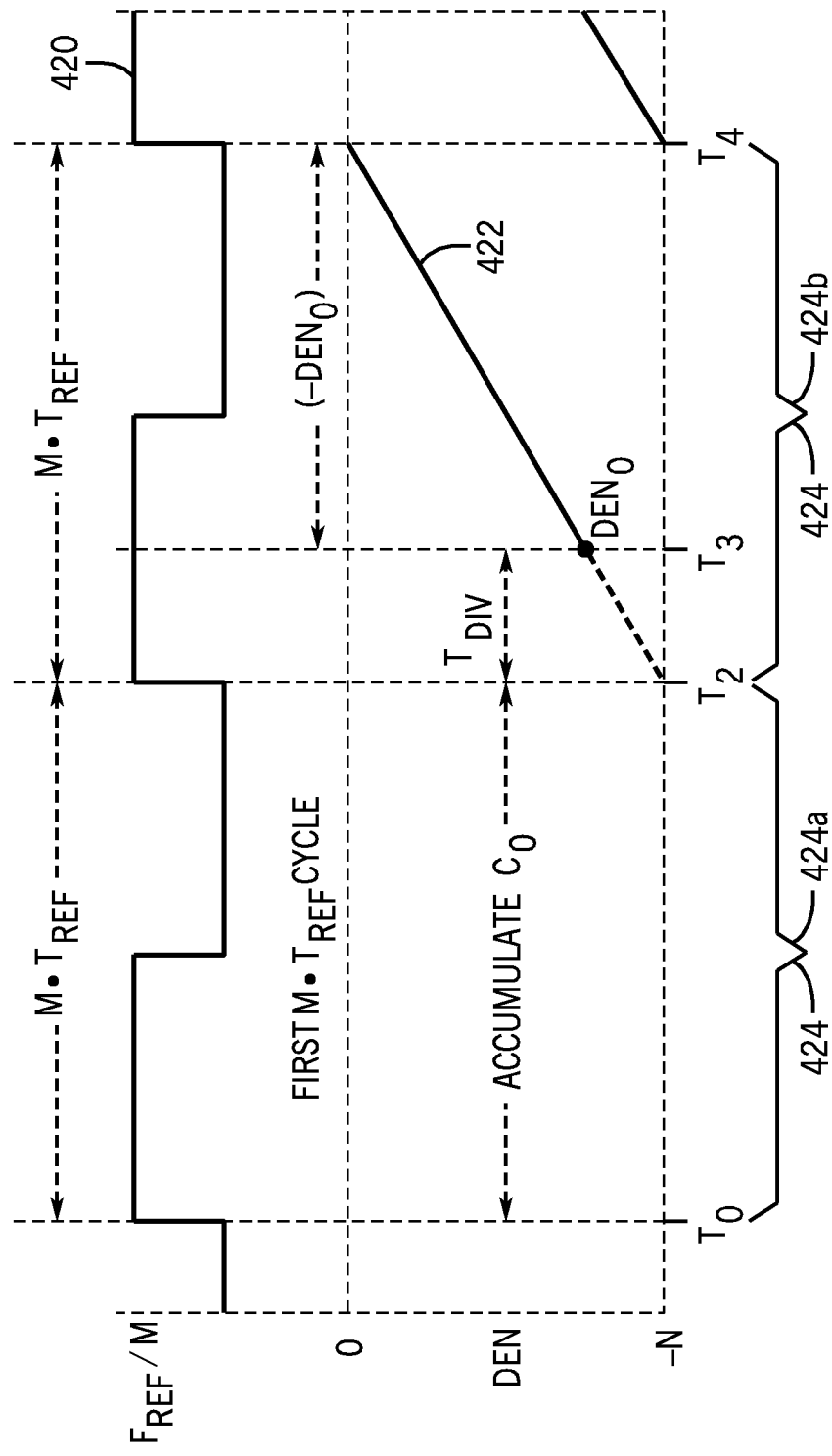

FIG. 7 illustrates a scenario in which cycle 424a is the first cycle of the frequency-divided reference clock signal in which the DLL 350 transitions from being disabled to being enabled. During the cycle 424a, an initial normalized control value (called "$C_0$") is accumulated. The next normalized control value for the DCO 360, called "$C_1$," is the following:

$$C_1 = \frac{\sum_{FirstCycle} C_0}{N}. \quad \text{Eq. 6}$$

Referring to FIG. 7 in conjunction with FIG. 4, for the next cycle 424b, the counter 385 is initialized to a value called "$DEN_0$," and begins counting at time $T_3$ (after the $T_{DIV}$ time), such that the count value of counter 385 is zero at time $T_4$, which is at the next rising, or positive, edge of the frequency-divided reference clock signal. If the $T_{DIV}$ time is hypothetically equal to zero (i.e., time $T_3$ is shifted to time $T_2$), then the $DEN_0$ value is equal to $-N$. However, for the actual case in which the $T_{DIV}$ time is finite, the $DEN_0$ value is given by the intercept of this same line with the $T_{DIV}$ period. Equating the slopes produces the following relationship:

$$\frac{(DEN_0 + N)}{T_{DIV}} = \frac{N}{T_{DIV} - DEN_0 \cdot T_1}. \quad \text{Eq. 7}$$

Solving for the $DEN_0$ value produces the following:

$$DEN_0 = -N + \frac{Q_{DIV} \cdot C_0}{C_1}. \quad \text{Eq. 8}$$

If $C_0$ and $C_1$ are approximately the same, which is a reasonable approximation, then the $DEN_0$ value may be estimated to be "$-N + Q_{DIV}$."

Figure 8:
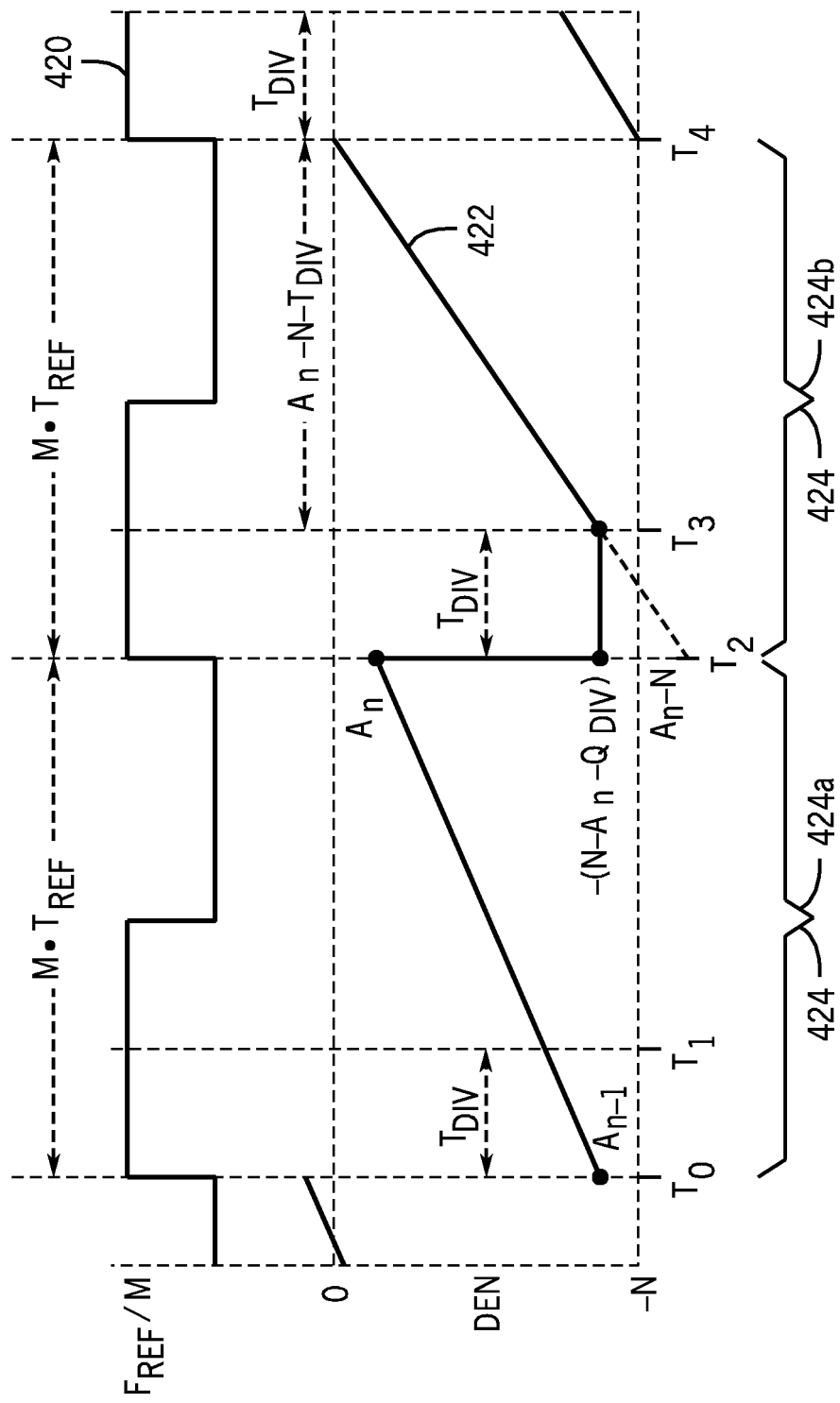

Referring to FIG. 8, in accordance with some embodiments of the invention, the phase tracker 384 adjusts the count value of the counter 385 in response to each positive edge of the frequency-divided reference clock signal, rather than when the count value reaches zero. Moreover, the phase tracker 384 reduces the count value by "$N - Q_{DIV}$" on each positive edge of the frequency-divided reference clock signal such that the count value is adjusted according to the denominator of Eq. 5, thereby creating an initial count for the register 385 of "$-(N - A_n - Q_{DIV})$" at the beginning of each cycle of the frequency-divided reference clock signal. Because this initial count is equal to the denominator of Eq. 5, this value is referred to as the "DEN denominator value" herein. As depicted in FIG. 8, the phase tracker 384, in accordance with some embodiments of the invention, inhibits the counter 385 from incrementing after the positive edge of the frequency-divided reference clock signal until after the $Q_{DIV}$ period elapses with no loss in phase information.

Figure 9:
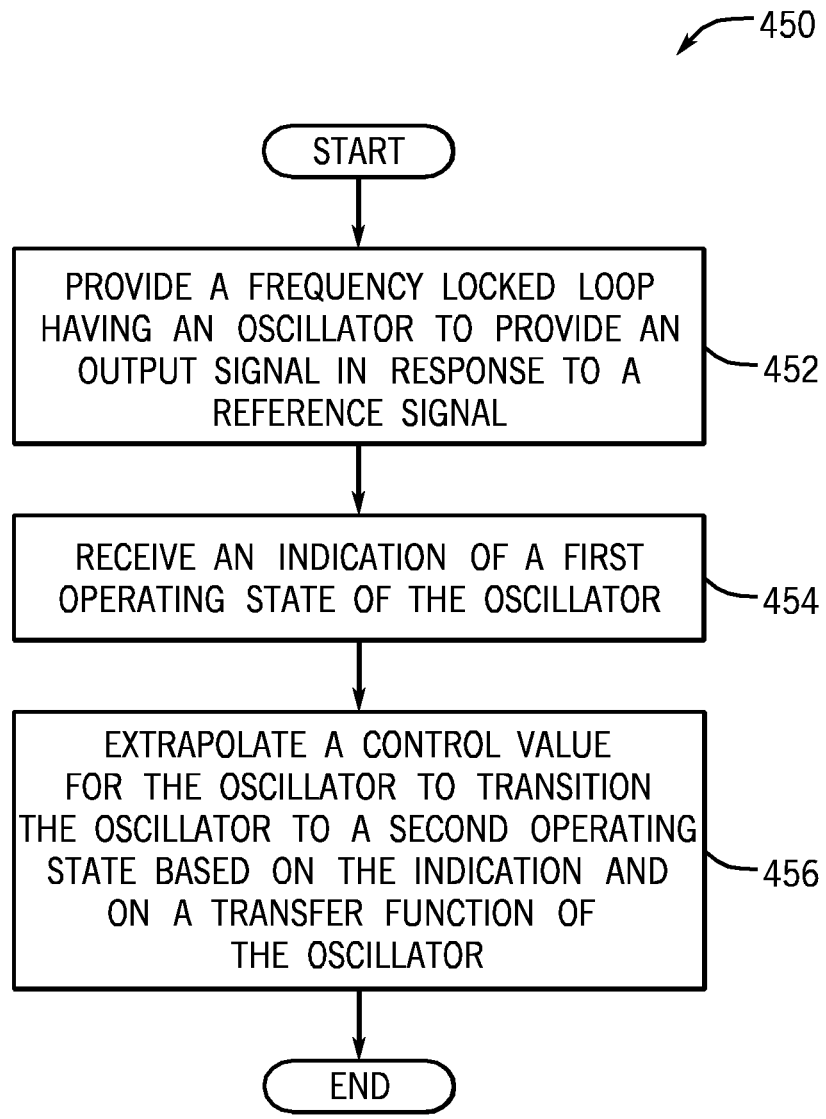
FIG. 9 is a flow diagram depicting a technique to control the digitally-controlled oscillator according to an embodiment of the invention.

Thus, referring to FIG. 9, in accordance with some embodiments of the invention, a technique 450 includes providing (block 452) a frequency locked loop that has an oscillator to provide an output signal in response to a reference signal. An indication of a first operating state of the oscillator (a current or previous operating state of the oscillator, as examples) is received (block 454) and a control value for the oscillator to transition the oscillator to a second operating state is extrapolated (block 456) based at least in part on the indication and on the transfer function of the oscillator. As a non-limiting example, the control value may be determined using a linear approximation to the oscillator's actual transfer function, in accordance with embodiments of the invention. The technique 450 may be repeated a number of times depending on the embodiment of the invention. For example, in accordance with some embodiments of the invention, the DLL 350 may repeat the technique 450 a specific number of times and then inhibit further changes to the control value. In other embodiments of the invention, the DLL 350 may implement the technique 450 repeatedly as long as the DLL 350 is enabled.

Figure 10:
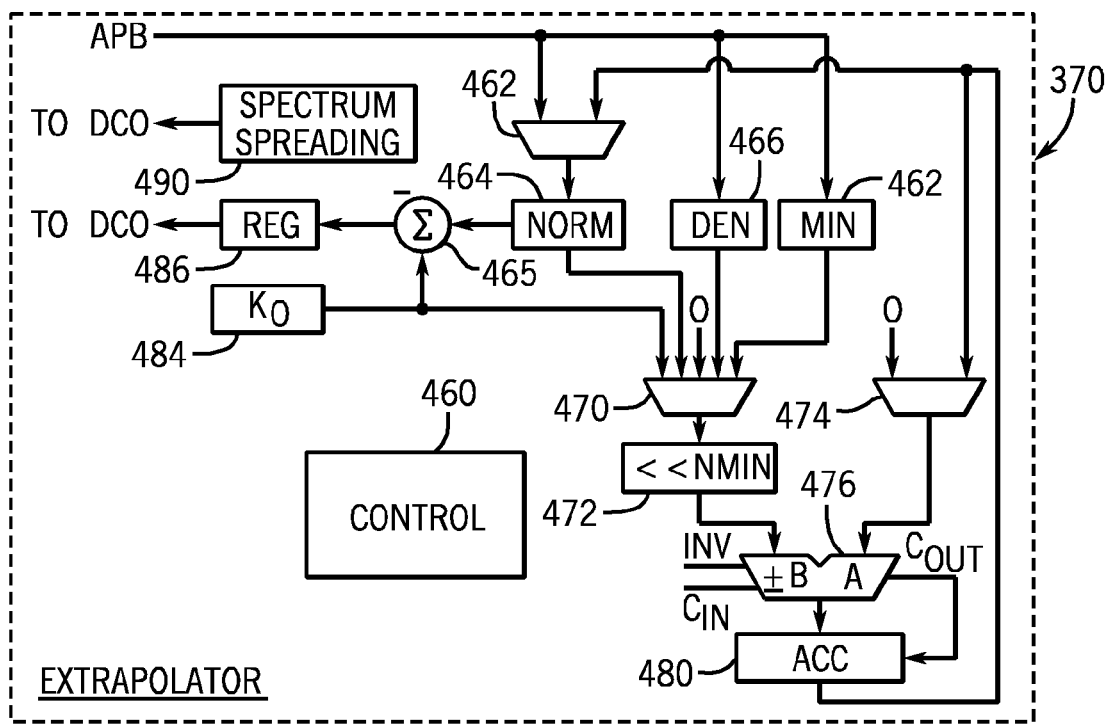
FIG. 10 is a schematic diagram of an extrapolator of the digital locked loop of FIG. 4 according to an embodiment of the invention.

In accordance with some embodiments of the invention, the extrapolator 370 has an architecture similar to the one depicted in FIG. 10, although the extrapolator may have other architectures, in accordance with the many possible embodiments of the invention. As non-limiting examples, other possible architectures may incorporate programmable elements, such as processors, microcontrollers, and programmable logic devices. Referring to FIG. 10, in general, the extrapolator 370 includes an arithmetic logic unit (ALU), which includes multiplexers 470 and 474, a left shifter 472 and an adder 476. The ALU in combination with a register 480 permits accumulation, division, delay correction and limit checks for the extrapolator 370 to calculate each new CNTL control value as described herein. The extrapolator 370 further includes a NORM register 464 that stores the current normalized control value (i.e. CNTL-$K_0$), a register 468 that stores a minimum allowed value (MIN) for the normalized control value, and a register 484 that stores a value for the $K_0$ constant value. The extrapolator 370 further includes a DEN denominator value calculator 466.

As depicted in FIG. 10, the multiplexer 470, depending on the particular operation being performed, selects either the $K_0$ value, the normalized control value, the DEN denominator value, the MIN value, or zero. Moreover, the multiplexer 474 either selects the content of the register 480 or zero, depending on the particular value being calculated.

As also depicted in FIG. 10, the extrapolator 370 includes a multiplexer 462, which receives either a value from the processor bus or the content that is stored in the register 480. The multiplexer 462 has its output terminals coupled to the control register 464. This arrangement permits the updating of the normalized control value to the new extrapolated value, as described above.

Among the other features of the extrapolator 370, the extrapolator 370 also includes an adder 465 that adds the $K_0$ value to the normalized control value stored in the NORM register 464 (in accordance with some embodiments of the invention) to produce the CNTL control value for the DCO 360, which is stored in a register 486. Additionally, the extrapolator 370 includes a spectrum spreading modulator 490 that furnishes a signal to the DCO 360 for purposes of implementing frequency hopping associated with the spectrum spreading, in accordance with some embodiments of the invention. In this manner, the modulator 490 may, for example, change the N value, the M value or both of the M and N values for purposes of changing the frequency of the DLL's output clock signal according to a frequency hopping schedule. The modulator 490 may also implement frequency hopping by directly altering the CNTL control value, for example by adding a sequence of random or pseudo-random values to the control value at regular (or irregular) intervals. As also shown in FIG. 10, the extrapolator 370 includes a control unit 460 for purposes of controlling the above-described operations of the extrapolator 370.

Figure 11:
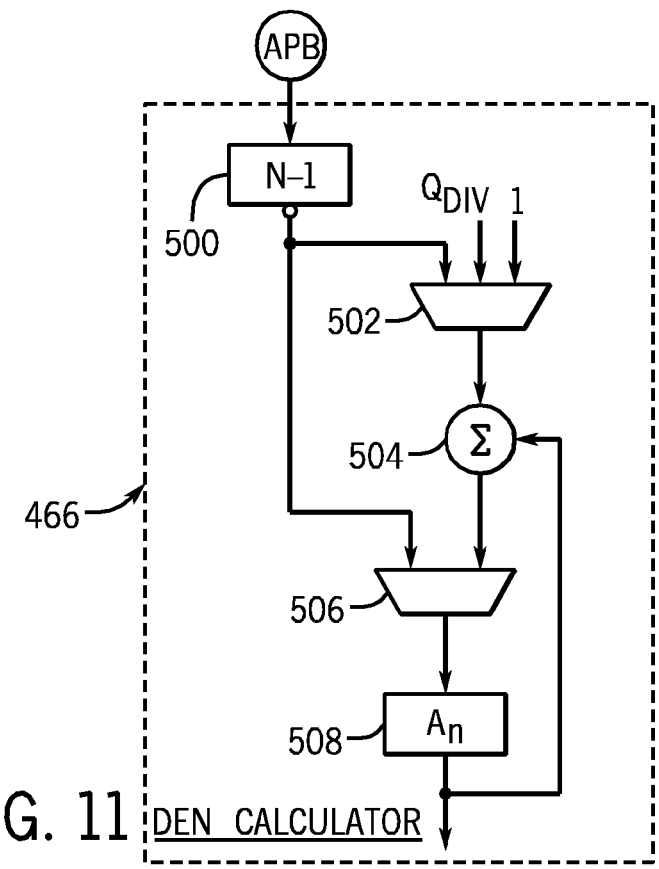
FIG. 11 is a schematic diagram of a circuit to determine a counter initialization value and update values for the phase tracker of FIG. 4 according to an embodiment of the invention.

Referring to FIG. 11, in accordance with some embodiments of the invention, the DEN denominator value calculator 466 (see FIG. 10) has an architecture which uses a dedicated accumulator in addition to a register 508 for purposes of tracking the phase error. The accumulator includes a register 500 that stores a value equal to N−1; and a multiplexer 502 that selects the ones-complement of the N−1 value, the $Q_{DIV}$ value or one for purposes of providing the selected value to an adder 504. The adder 504 adds the value provided by the multiplexer 502 to the content of the register 508 and provides this value to an input terminal of a multiplexer 506. Another input of the multiplexer 506, in turn, receives the ones-complement of the N−1 value, and the output terminal of the multiplexer 506 furnishes the value that is stored in the register 508. Due to this arrangement, when the calculator 466 determines the DEN denominator value, the register 508 stores the $A_N$ value; and −N and $Q_{DIV}$ are added to the $A_N$ value. When not calculating the $A_N$ value, the DEN calculator 466 increments the value that is stored in the register 508 to track the phase error.

Figure 12:
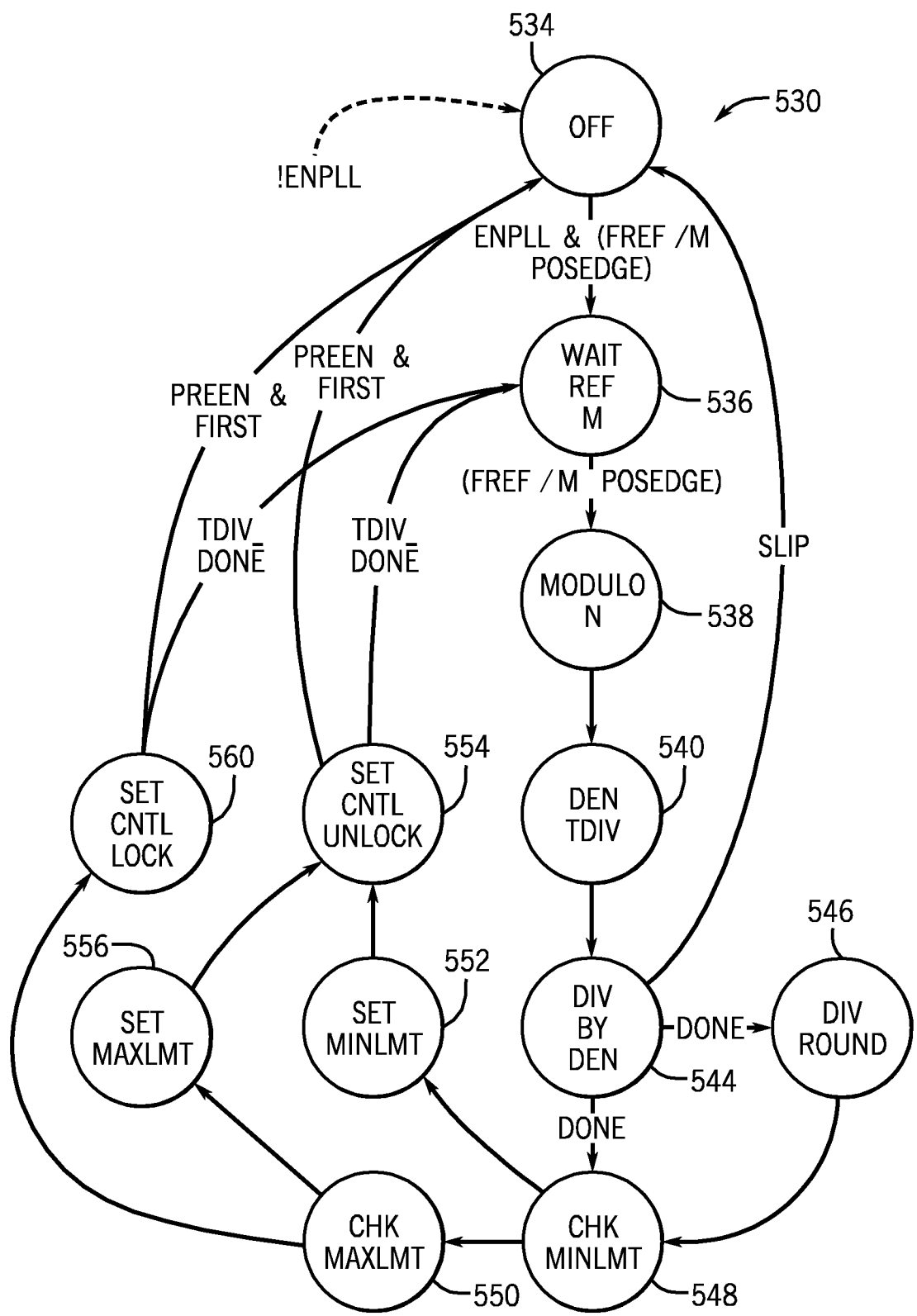
FIG. 12 is a state diagram for the extrapolator of the digital locked loop of FIG. 4 according to an embodiment of the invention.

FIG. 12 depicts a state diagram 530 for the control unit 460 (see FIG. 10) of the extrapolator 370, in accordance with some embodiments of the invention. In general, the control unit 460 manages the lock sequence and manages the control of the arithmetic processing by the extrapolator 370. The extrapolator 370 transitions to an off state 534 when the DLL 350 is disabled. In accordance with some embodiments of the invention, the disabling of the DLL 350 involves disabling the DCO 360. Upon the DLL 350 being enabled and upon the first positive edge of the frequency-divided reference clock signal, the extrapolator 370 transitions to a wait state 536 in which the extrapolator 370 accumulates the normalized control value while waiting for the next positive edge of the frequency-divided reference clock signal. Upon the next positive edge of the frequency-divided reference clock signal, the extrapolator 370 transitions to a modulo N state 538, in which the extrapolator 370 subtracts the $Q_{DIV}$·NORM product from the accumulator of the extrapolator 370 and adds −N to the DEN denominator value.

The extrapolator 370 then transitions to a state 540 in which the extrapolator 370 adds the $Q_{DIV}$ to the DEN denominator value. Control then transitions to state 544 in which the extrapolator 370 performs the shift-and-subtract division of the update equation. When the above-described arithmetic operations are performed, the extrapolator 370 transitions to a state 546 in which the extrapolator 370 rounds the division result. At this point, the extrapolator 370 has derived a candidate normalized control value.

The extrapolator 370 next transitions to states 548 and 550 for purposes of checking whether the candidate normalized control value is within an allowed range. More specifically, the extrapolator 370 transitions to state 548 for purposes of checking whether the candidate normalized control value exceeds a minimum limit and transitions to state 550 for purposes of determining whether the candidate normalized control value exceeds a maximum limit. If the candidate normalized control value is within the allowed range, then the candidate normalized control value becomes the new normalized control value, and the DLL 350 is locked both in frequency and phase, in accordance with some embodiments of the invention. Therefore, if locking has occurred (as indicated by the new normalized control value being within the allowed range), the extrapolator 370 transitions to a state 560 in which a flag is set indicating the locked state of the DLL 350, and control transitions back to either state 534 or 536, as described below.

If the candidate normalized control value is outside of the allowed range, then locking has not yet occurred. More specifically, if the candidate normalized control value is less than the minimum limit, then control transitions from state 548 to state 552, in which the extrapolator 370 sets the normalized control value stored in the NORM register 464 to the minimum limit. If the normalized control value is greater than the maximum limit, then control transitions from state 550 to state 556 in which the extrapolator 370 sets the normalized control value stored in the NORM register 464 to the maximum limit. Both states 552 and 556 transition to state 554, in which the extrapolator 370 sets a flag indicating that the DLL 350 is unlocked.

Control transitions from either state 554 (when the DLL 350 is unlocked) or 560 (when the DLL 350 is locked) to either state 534 or state 536, depending on whether the DLL 350 is in the first cycle (state 534) of the frequency-divided reference clock signal or in a subsequent cycle (state 536) of this clock signal.

Figure 13:
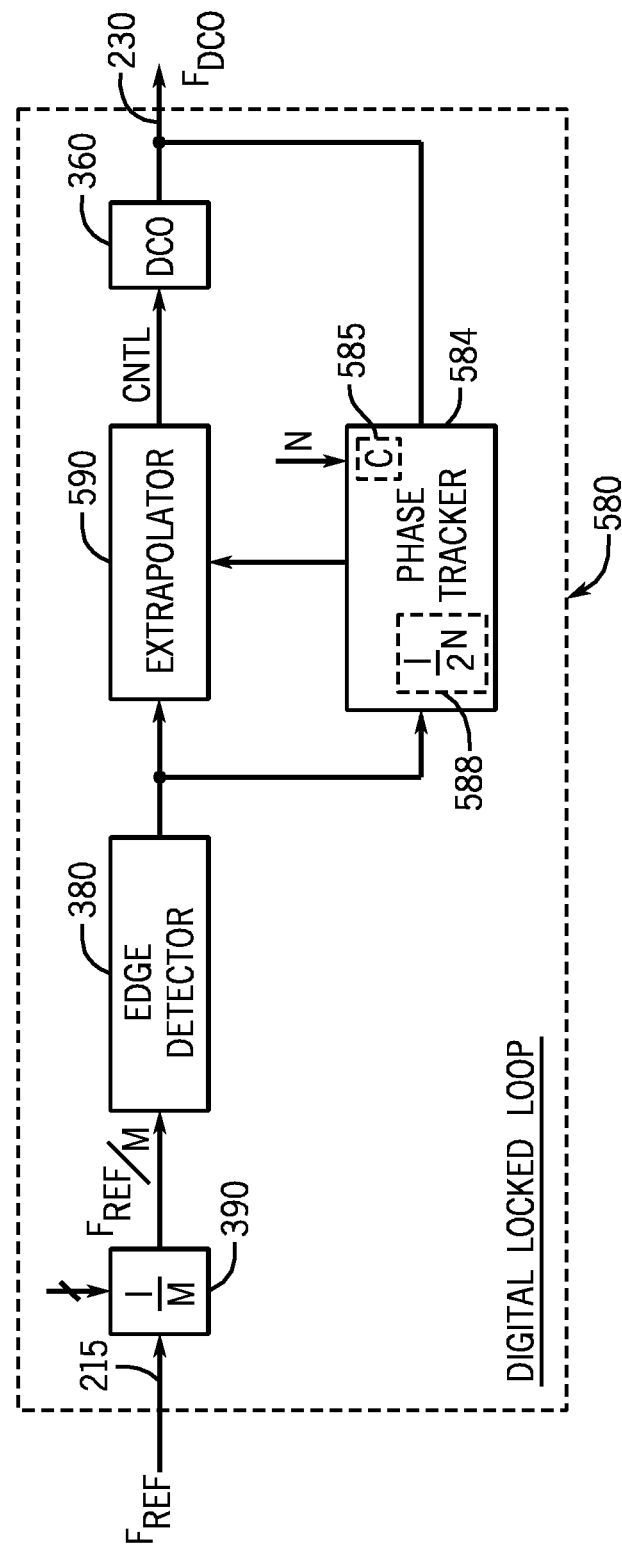

Referring to FIG. 13, in accordance with other embodiments of the invention, the DLL 350 (see FIG. 4) may be replaced with a DLL 580. The DLL 580 has features that are similar to corresponding features of the DLL 350, with the similar components being denoted by the same reference numerals. Unlike the DLL 350, the DLL 580 includes an extrapolator 590, which employs a two-stage control scheme: a first stage in which the extrapolator 590 determines a control value (called "C" herein) to frequency lock the DLL 580; and a second stage in which the extrapolator 590 determines a control value (called "C'" herein) to phase lock the DLL 580. For these embodiments of the invention, when the DLL 580 is frequency locked, there are $2^N$ periods of the output clock signal (instead of N) in one period of the frequency-locked reference signal. Therefore, a phase tracker 584 (replacing the phase tracker 384) includes an incrementing counter 585 that counts through a count value of $2^N$ when the DLL 580 is frequency locked.

More specifically, in these embodiments of the invention, the extrapolator 590 corrects for the frequency error on the rising edge of the frequency-divided reference clock signal and corrects for the phase error on the falling, or negative, edge of a clock signal that is a frequency-divided version of the output signal for the DLL 580. More specifically, in accordance with some embodiments of the invention, this frequency-divided version of the output clock signal has a frequency of $F_{DCO}/2^N$, which is provided by a frequency divider 588 of the phase tracker 584.

Figure 14:
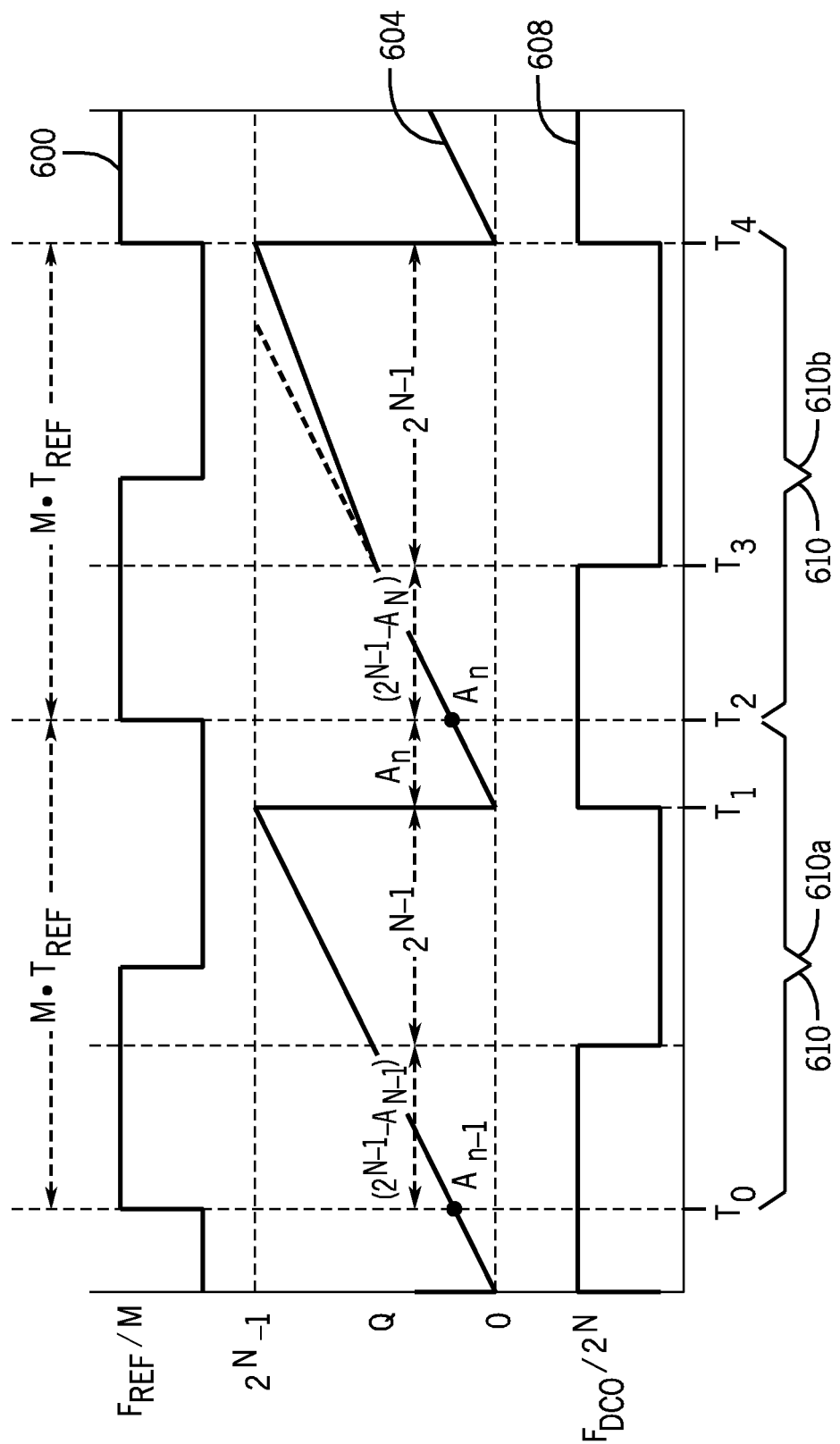
FIG. 14 illustrates waveforms associated with a two stage control scheme for locking the digital locked loop according to an embodiment of the invention.

To illustrate the two stage control, FIG. 14 depicts a waveform 600 of the frequency-divided reference clock signal for two successive cycles 610: an initial cycle 610a for which the DLL 580 is not locked to frequency or phase; and a successive cycle 610b for which the DLL 580 locks onto frequency and phase in two stages. FIG. 14 also depicts a waveform 604 of the value of the phase tracker's counter and a waveform 608 of the above-mentioned frequency-divided output clock signal, which is provided by the frequency divider 588. At time $T_2$ on the rising, or positive, edge of the frequency-divided reference clock signal, the extrapolator 590 adjusts for frequency locking; and at time $T_3$ on the falling, or negative, edge of the frequency-divided output clock signal, the extrapolator 590 adjusts for a phase lock.

For this two stage control, there are two control values: a control value called "$C_i$" which is the control value for the frequency correction; and a control called "$C'_i$" which is the control value for the phase correction. In these expressions, the index "i" represents the particular sequence of the control value such as n−1, n, n+1, etc. Equating the time periods of the cycles 610a and 610b produces the following equation:

$$(2^{N-1}-A_{n-1})\cdot C_{n-1}+(2^{N-1}+A_n)\cdot C'_{n-1}=(2^{N-1}-A_n)\cdot C_n+2^{N-1}\cdot C'_n \quad \text{Eq. 9}$$

Solving for $C'_n$ produces the following:

$$C'_n = \frac{(2^{N-1}-A_{n-1})\cdot C_{n-1} + (2^{N-1}-A_n)\cdot C'_{n-1}-(2^{N-1}-A_n)\cdot C_n}{2^{N-1}}, \quad \text{Eq. 10}$$

and the frequency correction component may then be described as follows:

$$C_n = \frac{(2^{N-1}-A_{n-1})\cdot C_{n-1} + (2^{N-1}+A_n)\cdot C'_{n-1}}{2^N}. \quad \text{Eq. 11}$$

Similar to before, the numerators of Eqs. 10 and 11 are accumulations of the active control values, and the denominators of Eqs. 10 and 11 merely involve shift only operations.

It is noted that the phase correction is optional, and as such, only the $C_n$ control value may be used, in accordance with some embodiments of the invention, with the phase correction not being used. Thus, in accordance with some embodiments of the invention, the DLL may operate only in a frequency-lock mode using the above-described two stage control estimation.

Figure 15:
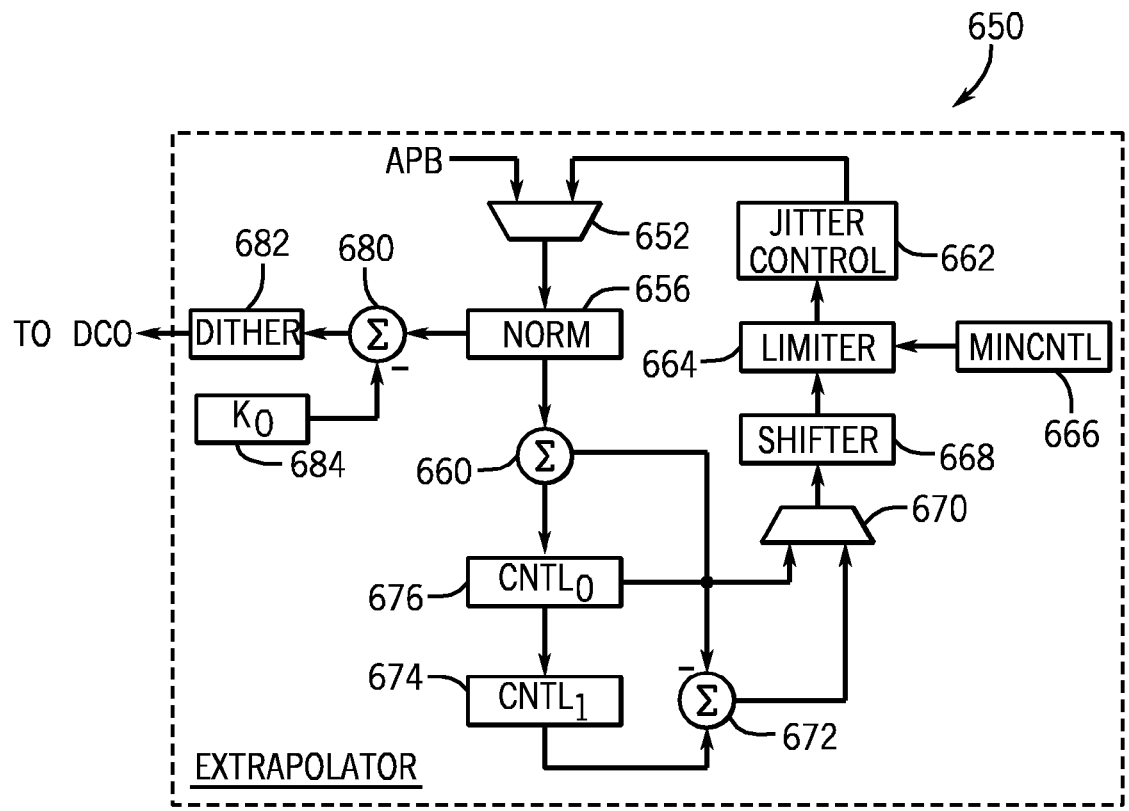
FIG. 15 is a schematic diagram of an extrapolator that uses the two stage control scheme according to an embodiment of the invention.

Referring to FIG. 15, in accordance with some embodiments of the invention, the extrapolator 590 may have an architecture 650. This architecture 650 includes a register that accumulates the active normalized control value used for frequency correction and a register 674 that stores the previous accumulated normalized control value. The difference of the active and previous accumulations (obtained via an adder 672) may be used for phase correction. Thus, a multiplexer 670 of the architecture 650 selects either the act of control value stored by block 676 or the difference of the active and previous accumulations obtained via adder 672. The denominator value is calculated via a shifter 668 and limiter 664. Moreover, the limiter 664 limits the minimum normalized control value to a threshold value (MINCNTL) that is stored in a register 666. The result is received by jitter control 662, which limits the control steps when the DLL is locked. As also depicted in FIG. 15, a multiplexer 652 accepts either an initial value for the normalized control value, which is stored in a register 656 or the value provided from the jitter control 662. The normalized control value stored in the register 656 is then algebraically combined with the $K_0$ offset (stored in a register 684), and this result is then provided to dither control 682 before being provided to the DCO 360. In accordance with some embodiments of the invention, the dither control 682 improves the DCO resolution and output jitter by providing finer frequency control steps by allowing the control frequency to dither between two settings, as can be appreciated by the skilled artisan.

Figure 16:
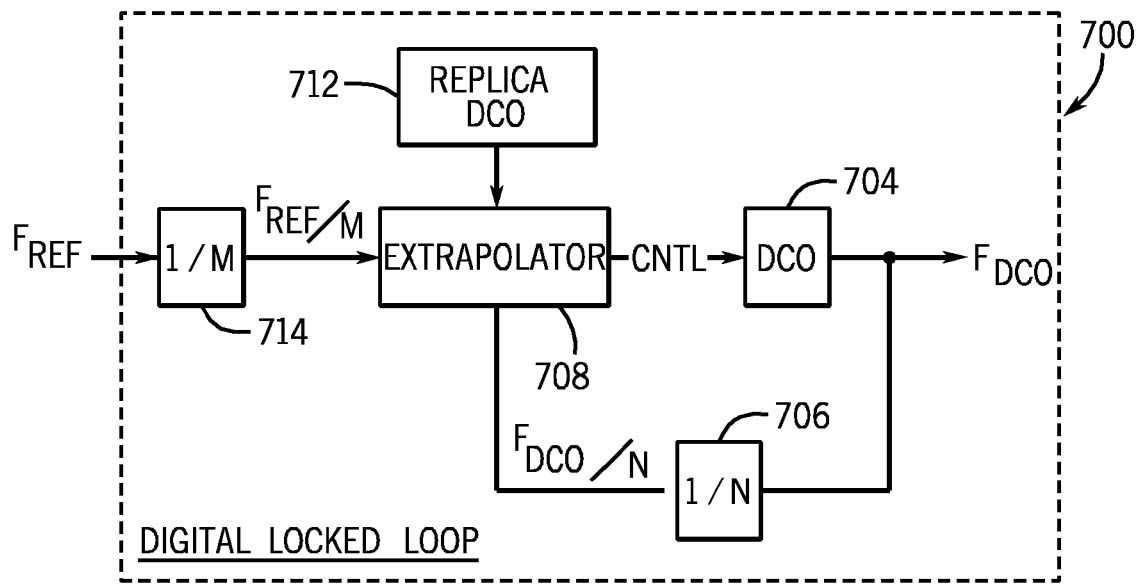

Referring to FIG. 16, in accordance with some embodiments of the invention, a DLL 700 may be used, which uses a replica DCO 712 in addition to a DCO 704 that provides the output clock signal. As a non-limiting example, the replica DCO 712 and the DCO 704 may have the same exact design. However, the DCO 712 may have a slightly different design than the DCO 704 and still be considered a replica. In this manner, in accordance with some embodiments of the invention, the replica DCO 712 may have a different design than the DCO 704 but have a transfer function that varies within ten percent of the transfer function of the DCO 704.

As depicted in FIG. 16, the DLL 700 also includes a frequency divider (a 1/N divider) 706, that provides a frequency-divided version of the output signal to an extrapolator 708. The DLL 700 also includes a frequency divider (a 1/M divider) 714, which provides a frequency-divided version of the reference clock signal to the extrapolator 708. The replica DCO 712 operates at a constant frequency and oversamples the reference clock signal.

Figure 17:
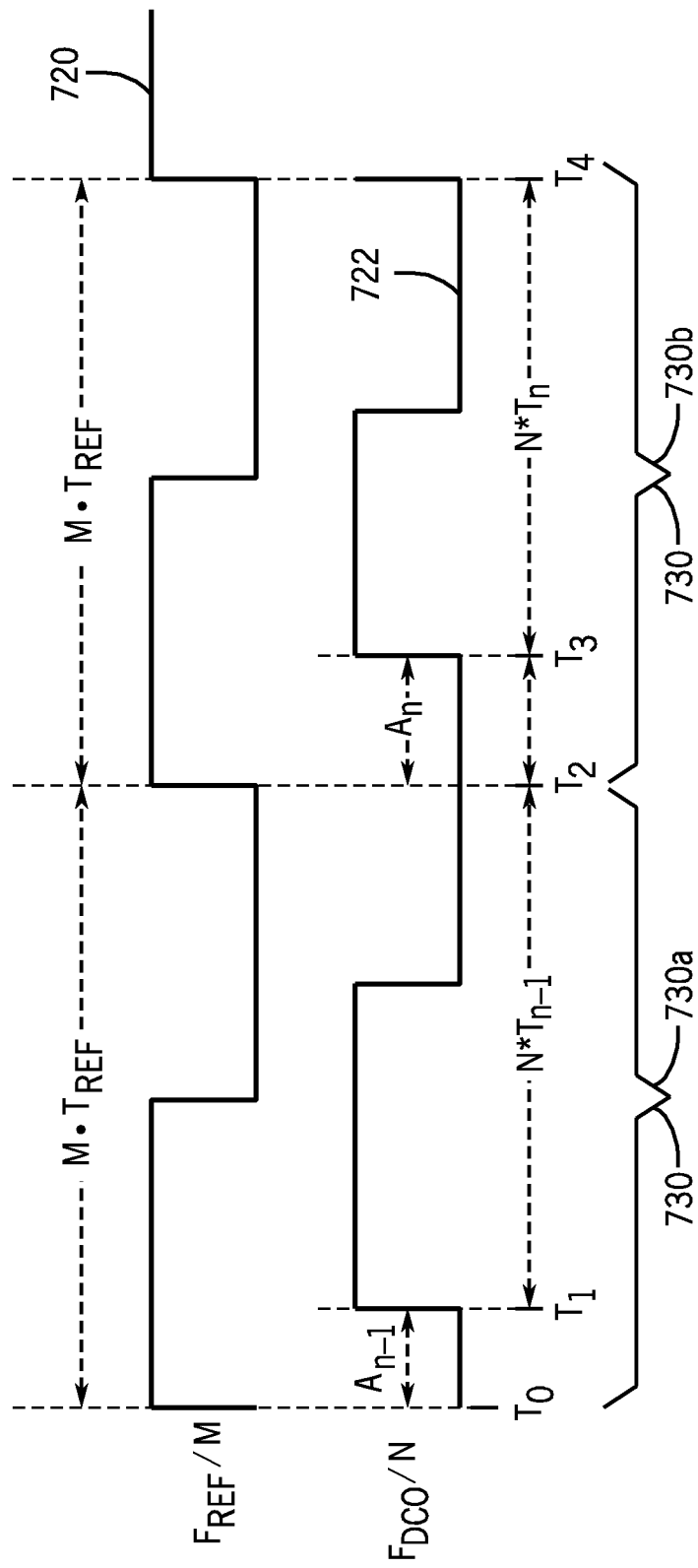
FIG. 17 illustrates waveforms associated with the digital locked loop of FIG. 16 according to an embodiment of the invention.

Referring to FIG. 17, the replica DCO 712 used to count DCO cycles between positive edges of the frequency-divided reference and output clock signals. This is illustrated in FIG. 17, which depicts a waveform 720 of the frequency-divided reference clock signal and a waveform 722 of the frequency-divided output clock signal. In this manner, this example depicts two successive cycles 740 of the frequency-divided reference clock signal: an initial cycle 730a in which the DLL is unlocked and a successive cycle 730b in which locking is achieved. In cycle 730a, the positive going edge of the frequency-divided output clock signal leads the positive going edge of the frequency-divided reference clock signal by a count of $A_{n-1}$.

The extrapolator 708 (see FIG. 16) solves for the next control value by equating the periods of the cycle 730a and 730b, as set forth below:

$$A_{n-1} \cdot T_{OSC} + N \cdot T_{n-1} - A_n \cdot T_{OSC} = A_n \cdot T_{OSC} + N \cdot T_n \quad \text{Eq. 12}$$

where "$T_{OSC}$" represents the replica DCO period; "$T_n$" represents the period of the output clock signal for which a corresponding control value is calculated; and "$T_{n-1}$" represents the period of the output clock signal in the previous cycle. Solving for the $T_n$ period results in the following:

$$T_n = T_{n-1} + \frac{(A_{n-1} - 2A_n) \cdot T_{OSC}}{N}, \quad \text{Eq. 13}$$

and the DCO generally has the following linear transfer function:

$$T_n = J_0 \cdot (CNTL_n + K_0) \quad \text{Eq. 14}$$

where "$J_0$" and "$K_0$" represent constants. Assuming that the replica DCO 712 is indeed an exact replica of the DCO 704 produces the following result:

$$(CNTL_n + K_0) = \quad \text{Eq. 15}$$
$$(CNTL_{n-1} + K_0) + \frac{(A_{n-1} - 2A_n) \cdot (CNTL_{OSC} + K_0)}{N},$$

where "$(CNTL_n + K_0)$" is the CNTL control value used to drive the DCO 704.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
   using a frequency locked loop having an oscillator to provide an output signal in response to a reference signal;
   receiving an indication of a first operating state of the oscillator; and
   based on the indication and on a transfer function of the oscillator, extrapolating a control value for the oscillator to cause a transition of the oscillator to a second operating state, the extrapolating comprising determining a control value to synchronize a frequency of the output signal with a frequency of the reference signal, wherein the extrapolating comprises counting a number of cycles of the oscillator between transitions of the reference signal.

2. The method of claim 1, further comprising synchronizing the transition of the oscillator to the second operating state with the reference signal.

3. The method of claim 1, wherein the extrapolating comprises determining a control value to synchronize a phase of the output signal with a phase of the reference signal.

4. The method of claim 1, the method further comprising subsequently determining another control value to transition the oscillator to another operating state to synchronize a phase of the output signal to a phase of the reference signal.

5. The method of claim 1, wherein the first operating state comprises a current operating state.

6. The method of claim 1, wherein the extrapolating is further based on selectable frequency ranges for the oscillator.

7. The method of claim 6, further comprising automatically selecting the frequency ranges based on the control value.

8. The method of claim 1, further comprising selectively allowing the frequency locked loop to operate in an open loop mode without further updating the control value while the frequency locked loop is operating in the open loop mode.

9. A locked loop circuit comprising:
   an oscillator to, in a first operating state, generate an output signal in response to a first control value for a control parameter;
   an extrapolator to extrapolate a second value for the control parameter based at least in part on a second operating state of the oscillator predicted by a modeled transfer function of the oscillator and the first operating state; and
   a phase tracker circuit adapted to count a number of cycles of the oscillator between logic level transitions of the reference signal,
   wherein the extrapolator is further adapted to base the determination of the second control value on an indication of the number of cycles provided by the phase tracker circuit.

10. The locked loop circuit of claim 9, wherein the extrapolator is adapted to synchronize the transition of the oscillator to the second operating state with the reference signal.

11. The locked loop circuit of claim 9, wherein the extrapolator is adapted to determine the second control value to synchronize a frequency of the output signal with a frequency of a reference signal.

12. The locked loop circuit of claim 9, wherein the extrapolator is adapted to determine the second control value to synchronize a phase of the output signal to a phase of the reference signal.

13. The locked loop circuit of claim 11, wherein the extrapolator is further adapted to determine another control value to synchronize a phase of the output signal with a phase of the reference signal.

14. A locked loop circuit comprising:
a first oscillator to generate an output signal in response to a control value;
a second oscillator having substantially the same transfer function as the first oscillator;
a phase tracker circuit adapted to indicate a phase error between the output signal and a reference signal as a function of a number of cycles of the second oscillator; and
an extrapolator to determine the control value for the first oscillator to transition the first oscillator to a new operating state based on a transfer function of the first oscillator and the phase error indicated by the phase tracker circuit.

15. The locked loop circuit of claim 14, wherein the extrapolator is adapted to regulate the control value to lock the first oscillator to the reference signal, and the second oscillator operates independently from the regulation.

16. The locked loop circuit of claim 14, wherein the extrapolator is adapted to lock the output signal in frequency and phase to the reference signal.

17. A method comprising:
using a frequency locked loop having an oscillator to provide an output signal in response to a reference signal;
receiving an indication of a first operating state of the oscillator; and
based on the indication, selectable frequency ranges for the oscillator and on a transfer function of the oscillator, extrapolating a control value for the oscillator to cause a transition of the oscillator to a second operating state.

18. The method of claim 17, further comprising synchronizing the transition of the oscillator to the second operating state with the reference signal.

19. The method of claim 17, wherein the extrapolating comprises counting a number of cycles of the oscillator between transitions of the reference signal.

20. The method of claim 17, wherein the extrapolating comprises determining a control value to synchronize a phase of the output signal with a phase of the reference signal.

21. The method of claim 17, the method further comprising subsequently determining another control value to transition the oscillator to another operating state to synchronize a phase of the output signal to a phase of the reference signal.

22. The method of claim 1, wherein the transfer function comprises a modeled transfer function predicting a response of the oscillator to a change in the control value.

* * * * *